United States Patent
Oomae et al.

(10) Patent No.: US 9,935,074 B2
(45) Date of Patent: Apr. 3, 2018

(54) SEMICONDUCTOR DEVICE AND METHOD FOR MANUFACTURING SAME

(71) Applicant: DENSO CORPORATION, Kariya, Aichi-pref. (JP)

(72) Inventors: Syoichirou Oomae, Kariya (JP); Akira Iwabuchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/128,126

(22) PCT Filed: Mar. 23, 2015

(86) PCT No.: PCT/JP2015/001622
§ 371 (c)(1),
(2) Date: Sep. 22, 2016

(87) PCT Pub. No.: WO2015/146130
PCT Pub. Date: Oct. 1, 2015

(65) Prior Publication Data
US 2017/0103962 A1    Apr. 13, 2017

(30) Foreign Application Priority Data

Mar. 26, 2014    (JP) .................................. 2014-64193

(51) Int. Cl.
*H01L 23/495* (2006.01)
*H01L 23/31* (2006.01)
(Continued)

(52) U.S. Cl.
CPC .......... *H01L 24/48* (2013.01); *H01L 21/4825* (2013.01); *H01L 21/4882* (2013.01); *H01L 21/565* (2013.01); *H01L 23/3114* (2013.01); *H01L 23/4952* (2013.01); *H01L 23/49503* (2013.01); *H01L 23/49551* (2013.01); *H01L 23/49562* (2013.01); *H01L 23/49572* (2013.01); *H01L 23/49575* (2013.01);
(Continued)

(58) Field of Classification Search
CPC ............ H01L 23/49568; H01L 21/565; H01L 23/49551
USPC ........................................... 257/695; 438/123
See application file for complete search history.

(56) References Cited

U.S. PATENT DOCUMENTS

2005/0199986 A1* 9/2005 Ma .................... H01L 23/49503
257/670
2006/0219008 A1* 10/2006 Tanaka ............... G01C 19/5607
73/504.16
(Continued)

FOREIGN PATENT DOCUMENTS

JP    2006-032470 A    2/2006
JP    2008-027994 A    2/2008
(Continued)

*Primary Examiner* — Moazzam Hossain
(74) *Attorney, Agent, or Firm* — Posz Law Group, PLC

(57) ABSTRACT

A lead frame has a first sink, an island, and a control terminal. The lead frame is bent, and at a rear surface, the island is positioned closer to one surface of a resin molded body than the first sink and a passive component mounting portion of the control terminal. A passive component is mounted on the passive component mounting portion of the control terminal through a bonding material, the passive component mounting portion being a part of one surface.

7 Claims, 9 Drawing Sheets

(51) Int. Cl.
*H01L 23/00* (2006.01)
*H01L 21/48* (2006.01)
*H01L 21/56* (2006.01)
*H02M 7/537* (2006.01)
*H02P 27/08* (2006.01)

(52) U.S. Cl.
CPC ............ *H02M 7/537* (2013.01); *H02P 27/08* (2013.01); *H01L 2224/48195* (2013.01); *H01L 2924/1203* (2013.01); *H01L 2924/1205* (2013.01); *H01L 2924/1207* (2013.01); *H01L 2924/13055* (2013.01); *H01L 2924/14253* (2013.01)

(56) References Cited

U.S. PATENT DOCUMENTS

| | | | |
|---|---|---|---|
| 2010/0193920 A1* | 8/2010 | Poh | H01L 21/565 257/676 |
| 2011/0310585 A1* | 12/2011 | Suwa | H05K 7/1432 361/820 |
| 2012/0175757 A1 | 7/2012 | Katsuki | |
| 2014/0210062 A1* | 7/2014 | Miyazaki | H01L 21/56 257/676 |

FOREIGN PATENT DOCUMENTS

| | | |
|---|---|---|
| JP | 2008-135613 A | 6/2008 |
| JP | 2008-218688 A | 9/2008 |

\* cited by examiner

SEMICONDUCTOR DEVICE AND METHOD FOR MANUFACTURING SAME

CROSS REFERENCE TO RELATED APPLICATIONS

This application is a U.S. national stage of International Application No. PCT/JP2015/001622 filed on Mar. 23, 2015 and is based on based on Japanese Patent Application No. 2014-64193 filed on Mar. 26, 2014, the disclosures of which are incorporated herein by reference.

TECHNICAL FIELD

The present disclosure relates to a semiconductor device that includes semiconductor chips including switching elements, a resin molding for sealing the semiconductor chips, and heat sinks disposed on both surfaces of the semiconductor chips and connected to main electrodes via soldering, and also relates to a method for manufacturing this semiconductor device.

BACKGROUND ART

There has been known a semiconductor device which includes semiconductor chips including switching elements (hereinafter referred to as first semiconductor chips), a resin molding for sealing the first semiconductor chips, and heat sinks disposed both surfaces of the first semiconductor chips, and connected to main electrodes via soldering, as described in Patent Literature 1.

PRIOR ART LITERATURES

Patent Literature

Patent Literature 1: JP 2008-135613 A

SUMMARY OF INVENTION

It is an object of the present disclosure to provide a semiconductor device capable of reducing connection failure of bonding wires while avoiding increase in size, and a method for manufacturing this semiconductor device.

A semiconductor device according to an aspect of the present disclosure includes a lead frame, a first semiconductor chip, a second heat sink, a second semiconductor chip, a passive component, and a resin molding. The lead frame includes one surface and a rear surface opposite to the one surface, and further includes a first heat sink, an island, and a control terminal, the island and the control terminal being separated from the first heat sink. The first semiconductor chip includes a first main electrode disposed on facing surface of the first semiconductor chip facing the rear surface, and further includes a control electrode and a second main electrode. The second main electrode is paired with the first main electrode. The control electrode and the second main electrode are disposed on a surface of the first semiconductor chip opposite to the facing surface. The first main electrode is connected to the first heat sink. The second heat sink is disposed opposed to the surface of the first semiconductor chip on which surface the control electrode is disposed. The second heat sink is connected to the second main electrode. The second semiconductor chip is fixed to the island on the rear surface to control driving of the first semiconductor chip. The second semiconductor chip is connected to the control electrode via a first bonding wire, and connected to the control terminal via a second bonding wire. The passive component is mounted on a passive component mounting portion of the control terminals via a bonding material.

The resin molding includes a surface on the first heat sink side, and a surface on the second heat sink side in a lamination direction of the first heat sink, the second heat sink, and the first semiconductor chip. The resin molding integrally seals the first semiconductor chip, the second semiconductor chip, the passive component, at least a part of the first heat sink and the second heat sink, the first bonding wire, the second bonding wire, the island, and a part of the control terminal including the passive component mounting portion.

A part of the lead frame is bent with respect to a rest of part of the lead frame such that the island is located closer to the first heat sink side surface of the resin molding on the rear surface than the first heat sink and the passive component mounting portion of the control terminals are. The passive component is mounted on the passive component mounting portion of the control terminal on the one surface.

The semiconductor device is capable of reducing connection failure of the first bonding wire and the second bonding wire while avoiding increase in size.

A method for manufacturing a semiconductor device according to another aspect of the present disclosure is a method for manufacturing semiconductor device that includes a lead frame, a first semiconductor chip, a second heat sink, a second semiconductor chip, a passive component, and a resin molding. The lead frame includes one surface and a rear surface opposite to the one surface, and further includes a first heat sink, an island, and a control terminal, the island and the control terminal being separated from the first heat sink. The first semiconductor chip includes a first main electrode disposed on a facing surface of the first semiconductor chip facing the rear surface, and further includes a control electrode and a second main electrode. The second main electrode is paired with the first main electrode. The control electrode and the second main electrode are disposed on a surface of the first semiconductor chip opposite to the facing surface. The first main electrode is connected to the first heat sink via solder. The second heat sink is disposed opposed to the surface of the first semiconductor chip on which surface the control electrode is disposed. The second heat sink is connected to the second main electrode via solder. The second semiconductor chip is fixed to the island on the rear surface to control driving of the first semiconductor chip. The second semiconductor chip is connected to the control electrode via a first bonding wire, and connected to the control terminal via a second bonding wire. The passive component is mounted on a passive component mounting portion of the control terminal via a bonding material.

The resin molding includes a surface on the first heat sink side, and a surface on the second heat sink side in a lamination direction of the first heat sink, the second heat sink, and the first semiconductor chip. The resin molding integrally seals the first semiconductor chip, the second semiconductor chip, the passive component, at least a part of the first heat sink and the second heat sink, the first bonding wire, the second bonding wire, the island, and a part of the control terminal including the passive component mounting portion.

According to the method for manufacturing the semiconductor device, the lead frame included in the semiconductor device is bent such that the island is located closer to the first heat sink side surface of the resin molding on the rear surface than the first heat sink and the passive component mounting portion of the control terminals are. A connection body that integrates the lead frame and the first semiconductor chips is formed by reflow of the solder between the first heat sink and the first semiconductor chip. The second semiconductor chip is fixed on the island. The control electrode and the second semiconductor chip are connected via the first bonding wire after the second semiconductor chip is fixed. The second semiconductor chip and the control terminal are connected via the second bonding wire. The connection body is reversed, and positioned on the second heat sink after the second semiconductor chip is connected via the first bonding wire and the second bonding wire. Reflow of the solder between the second heat sink and the connection body is carried out. The passive component is mounted on the passive component mounting portion of the control terminal on the one surface via the bonding member. The resin molding is molded after the passive component is mounted.

The manufacturing method manufactures a semiconductor device capable of reducing connection failure of the first bonding wire and the second bonding wire while avoiding increase in size.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
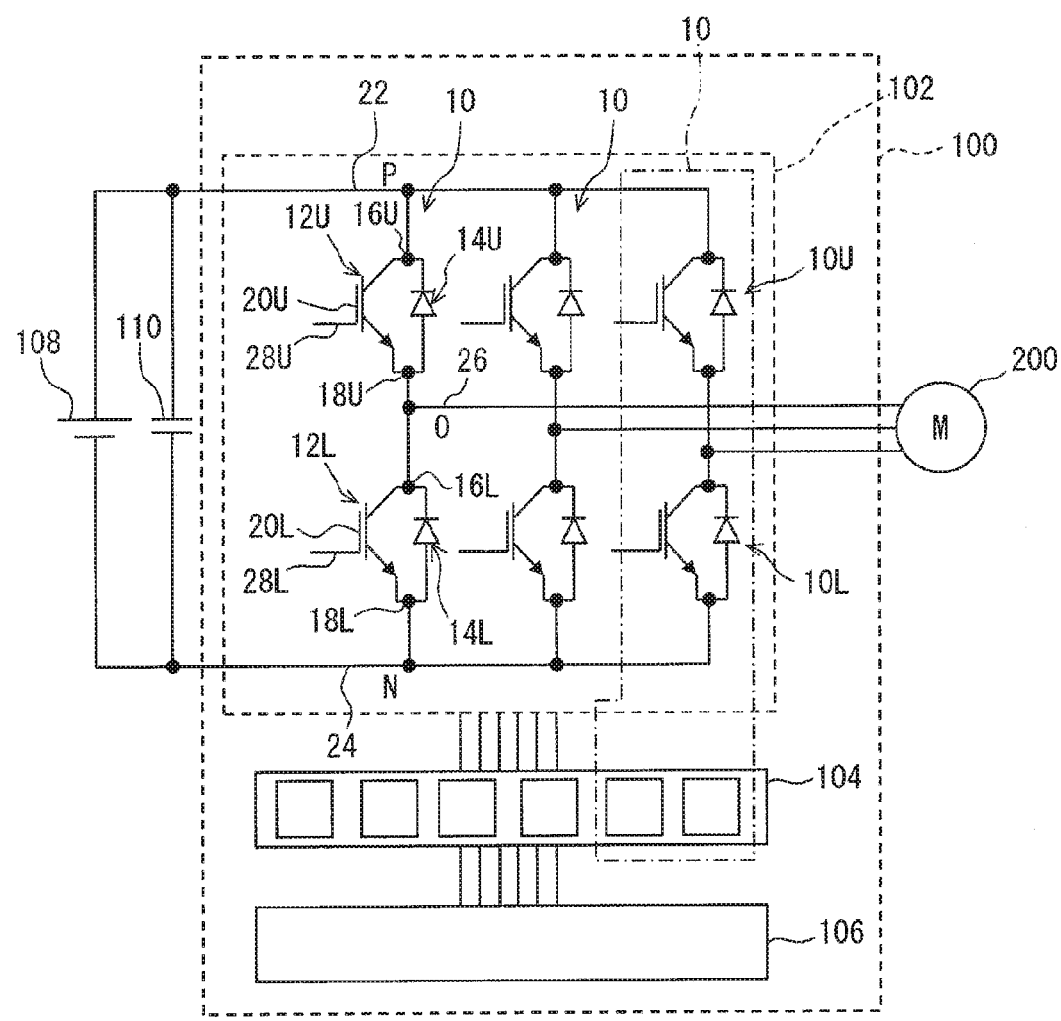
FIG. 1 is a side view illustrating a general configuration of a power converter incorporating a semiconductor device according to an embodiment of the present disclosure.

Before an embodiment of the present disclosure is described, initially touched upon herein are the circumstances under which the present inventors have arrived at the present disclosure and various modes provided according to the present disclosure. There may be considered such a semiconductor device which includes second semiconductor chips having circuits for controlling driving of switching elements, and passive components such as a chip resistor and a chip capacitor, in addition to constituent elements of the semiconductor device disclosed in Patent Literature 1, for the purpose of improvement of functions and noise resistance properties of the semiconductor device, for example.

In view of positioning easiness, for example, first heat sinks are constituted by a common lead frame, similarly to other components constituted by the common lead frame, such as islands on which the second semiconductor chips are disposed, and control terminals. The second semiconductor chips are connected to the first semiconductor chips via bonding wires. However, due to shape limitations of the bonding wires such as a connection angle, the size of the semiconductor device increases in the direction perpendicular to a lamination direction of the first semiconductor chips and the heat sinks, depending on the positions of the first semiconductor chips and the second semiconductor chips. Moreover, connection failure of the bonding wires easily occurs during connection of the bonding wires and resin molding.

Furthermore, each of the passive components has a small coating area of a bonding material, in which condition solder is difficult to wet-spread through an electrode of the passive component when the solder is constituted by a fluxless solder. For overcoming this difficulty, solder containing flux, Ag paste or like material is used as a bonding material for the passive components. However, these bonding materials generate scatterings such as flux, outgas, and fume. Accordingly, when the passive components lie on the lead frame on the same surface side as the second semiconductor chips, scattered flux or the like may contaminate the connection portions of the bonding wires, and cause connection failure of the bonding wires as a result of contamination of the bonding wires.

In consideration of the aforementioned difficulties, an object of the present disclosure is to provide a semiconductor device capable of reducing connection failure of bonding wires while avoiding increase in size, and a method for manufacturing this semiconductor device.

A semiconductor device according to an aspect of the present disclosure includes a lead frame, a first semiconductor chip, a second heat sink, a second semiconductor chip, a passive component, and a resin molding. The lead frame includes one surface and a rear surface opposite to the one surface, and further includes a first heat sink, an island, and a control terminal, the island and the control terminal being separated from the first heat sink. The first semiconductor chip includes a first main electrode disposed on facing surface of the first semiconductor chip facing the rear surface, and further includes a control electrode and a second main electrode. The second main electrode is paired with the first main electrode. The control electrode and the second main electrode are disposed on a surface of the first semiconductor chip opposite to the facing surface. The first main electrode is connected to the first heat sink. The second heat sink is disposed opposed to the surface of the first semiconductor chip on which surface the control electrode is disposed. The second heat sink is connected to the second main electrode. The second semiconductor chip is fixed to the island on the rear surface to control driving of the first semiconductor chip. The second semiconductor chip is connected to the control electrode via a first bonding wire, and connected to the control terminal via a second bonding wire. The passive component is mounted on a passive component mounting portion of the control terminals via a bonding material.

The resin molding includes a surface on the first heat sink side, and a surface on the second heat sink side in a lamination direction of the first heat sink, the second heat sink, and the first semiconductor chip. The resin molding integrally seals the first semiconductor chip, the second semiconductor chip, the passive component, at least a part of the first heat sink and the second heat sink, the first bonding wire, the second bonding wire, the island, and a part of the control terminal including the passive component mounting portion.

A part of the lead frame is bent with respect to a rest of part of the lead frame such that the island is located closer to the first heat sink side surface of the resin molding on the rear surface than the first heat sink and the passive component mounting portion of the control terminals are. The passive component is mounted on the passive component mounting portion of the control terminal on the one surface.

According to the semiconductor device, the lead frame is bent such that the island is located closer to the first heat sink side surface of the resin molding on the rear surface of the lead frame than the first heat sink and the passive component mounting portion of the control terminal are. In this case, the connection surface of the first bonding wire comes close to the first semiconductor chip and the second semiconductor chip in the lamination direction.

There are shape limitations to the bonding wire, such as a connection angle (in a range approximately from 40° to 50°, for example). When the connection surface of the first bonding wire is separated away in the lamination direction, the connection surface of the first bonding wire are required to be located away in the direction perpendicular to the lamination direction to obtain a predetermined connection angle, for example. According to the arrangement of the semiconductor device described above, however, the first semiconductor chip and the second semiconductor chip are located close to each other also in the direction perpendicular to the lamination direction. Accordingly, the size of the semiconductor device does not increase in the direction perpendicular to the lamination direction. Moreover, the connection surface of the first bonding wire is located closer in the lamination direction, and thus failure at the time of connection of the first bonding wire decreases. Furthermore, the connection length of the first bonding wire becomes short. Accordingly, connection failure caused when the bonding wire is pressed by resin pressure during resin molding decreases.

The second semiconductor chip is mounted on the rear surface of the lead frame, and the passive component is mounted on the one surface of the lead frame. Accordingly, connection failure of the bonding wire caused by scatterings such as flux decreases even when the bonding material of the passive component is made of solder containing flux, Ag paste or the like.

When a lead fame bent by pressing an entire island and a control terminal downward is used, the distance between one surface of the lead frame and the first heat sink side surface of the resin molding becomes short in the lamination direction. In this case, technical difficulties such as exposure of the passive components from the resin mold, and decrease in the resin thickness covering the passive component arise when the passive component is mounted on surface of the control terminal on one side. When the passive component is exposed, contact between the passive component and a mold is produced during molding of the resin molding. In this case, the passive component may be damaged. Moreover, moisture or the like entering from the outside may cause separation of the resin molding, or lower electric connection reliability. When the resin thickness is small, an entrainment void is easily produced.

According to the lead frame included in the semiconductor device described above, however, the passive component mounting portion of the control terminal is disposed farther from the first heat sink side surface of the resin molding than the islands are. Accordingly, the passive component is allowed to be disposed at the passive component mounting portion of the control terminal on the one surface opposite to the rear surface where the second semiconductor chip is mounted.

A method for manufacturing a semiconductor device according to another aspect of the present disclosure is a method for manufacturing semiconductor device that includes a lead frame, a first semiconductor chip, a second heat sink, a second semiconductor chip, a passive component, and a resin molding. The lead frame includes one surface and a rear surface opposite to the one surface, and further includes a first heat sink, an island, and a control terminal, the island and the control terminal being separated from the first heat sink. The first semiconductor chip includes a first main electrode disposed on a facing surface of the first semiconductor chip facing the rear surface, and further includes a control electrode and a second main electrode. The second main electrode is paired with the first main electrode. The control electrode and the second main electrode are disposed on a surface of the first semiconductor chip opposite to the facing surface. The first main electrode is connected to the first heat sink via solder. The second heat sink is disposed opposed to the surface of the first semiconductor chip on which surface the control electrode is disposed. The second heat sink is connected to the second main electrode via solder. The second semiconductor chip is fixed to the island on the rear surface to control driving of the first semiconductor chip. The second semiconductor chip is connected to the control electrode via a first bonding wire, and connected to the control terminal via a second bonding wire. The passive component is mounted on a passive component mounting portion of the control terminal via a bonding material.

The resin molding includes a surface on the first heat sink side, and a surface on the second heat sink side in a lamination direction of the first heat sink, the second heat sink, and the first semiconductor chip. The resin molding integrally seals the first semiconductor chip, the second semiconductor chip, the passive component, at least a part of the first heat sink and the second heat sink, the first bonding wire, the second bonding wire, the island, and a part of the control terminal including the passive component mounting portion.

According to the method for manufacturing the semiconductor device, the lead frame included in the semiconductor device is bent such that the island is located closer to the first heat sink side surface of the resin molding on the rear surface than the first heat sink and the passive component mounting portion of the control terminals are. A connection body that integrates the lead frame and the first semiconductor chips is formed by reflow of the solder between the first heat sink and the first semiconductor chip. The second semiconductor chip is fixed on the island. The control electrode and the second semiconductor chip are connected via the first bonding wire after the second semiconductor chip is fixed. The second semiconductor chip and the control terminal are connected via the second bonding wire. The connection body is reversed, and positioned on the second heat sink after the second semiconductor chip is connected via the first bonding wire and the second bonding wire. Reflow of the solder between the second heat sink and the connection body is carried out. The passive component is mounted on the passive component mounting portion of the control terminal on the one surface via the bonding member. The resin molding is molded after the passive component is mounted.

According to this manufacturing method, advantageous effects similar to those of the semiconductor device described above are offered. Moreover, according to this manufacturing method, the one surface of the lead frame is positioned above the rear surface after the connection body is reversed and positioned on the second heat sink. In this case, the passive component is disposed on the one surface of the passive component mounting portion of the control terminal in the reversed connection body via the bonding material. Thereafter, the passive component is mounted by heating during reflow of the solders between the second heat sink and the connection body. Accordingly, mounting of the passive component is completed without the necessity of an additional manufacturing step. Moreover, mounting of the passive component is executed after the connection of the second semiconductor chip via the first bonding wire and the second bonding wire, and thus connection failure of the bonding wire caused by scatterings such as flux is more securely avoidable.

An embodiment according to the present disclosure is hereinafter described with reference to the drawings. Identical or equivalent parts in the respective figures referred to hereinbelow have been given identical reference numbers.

In the following description, a lamination direction of a heat sink and a first semiconductor chip, in other words, a thickness direction of the first semiconductor chip is expressed as a Z-direction. An extension direction of a main terminal and a control terminal perpendicular to the Z-direction is expressed as a Y-direction. A direction perpendicular to both the Y-direction and the Z-direction is expressed as an X-direction. A planar shape in this context refers to a shape extending along a plane defined by the X-direction and the Y-direction unless specified otherwise.

An example of a power converter incorporating a semiconductor device according to this embodiment is initially described with reference to FIG. 1.

A power converter 100 illustrated in FIG. 1 includes an inverter 102 that drives a vehicle driving motor 200, a driver 104 that drives the inverter 102, and a microcomputer 106 that outputs driving signals to the inverter 102 via the driver 104. The power converter 100 thus constructed is included in an electric car or a hybrid electric car, for example.

Each of semiconductor devices 10 includes an upper arm portion 10U and a lower arm portion 10L connected with each other in series between a positive electrode (high potential side) and a negative electrode (low potential side) of a direct current power supply 108. The upper arm portion 10U is disposed on the high potential side of the direct current power supply 108, and the lower arm portion 10L is disposed on the low potential side of the direct current power supply 108.

The inverter 102 includes three phases each of which contains upper and lower arms constituted by the upper arm portion 10U and the lower arm portion 10L. The inverter 102 is configured to convert direct current power into three-phase alternating currents, and output the converted currents to the motor 200. A component indicated by a reference number 110 in FIG. 1 is a smoothing capacitor.

The driver 104 includes chips respectively corresponding to the arm portion 10U and 10L. Each of the chips includes a circuit for controlling driving of elements of the corresponding arm portion 10U or 10L. According to this embodiment, each of the semiconductor devices 10 includes one phase of the upper and lower arms, and the chips of the driver 104 corresponding to these upper and lower arms. Accordingly, both the inverter 102 and the driver 104 are constituted by the three semiconductor devices 10.

The upper arm portion 10U includes an n-channel IGBT element 12U, and a reflex FWD element 14U connected to the IGBT element 12U in anti-parallel. According to this embodiment, the IGBT element 12U and the FWD element 14U are provided on an identical semiconductor chip. However, the IGBT element 12U and the FWD element 14U may be provided on different chips.

The IGBT element 12U includes a collector electrode 16U and an emitter electrode 18U that are main electrodes, and a gate electrode 20U that is a control electrode. On the other hand, the FWD element 14U includes a cathode electrode constituted by the foregoing collector electrode 16U, and an anode electrode constituted by the foregoing emitter electrode 18U.

The lower arm portion 10L has a structure similar to the structure of the upper arm portion 10U. The lower arm portion 10L includes an n-channel IGBT element 12L, and a reflex FWD element 14L connected to the IGBT element 12L in anti-parallel. The IGBT element 12L and the FWD element 14L are provided on an identical semiconductor chip. However, the IGBT element 12L and the FWD element 14L may be provided on different chips.

The IGBT element 12L includes a collector electrode 16L and an emitter electrode 18L that are main electrodes, and a gate electrode 20L that is a control electrode. On the other hand, the FWD element 14L includes a cathode electrode constituted by the foregoing collector electrode 16L, and an anode electrode constituted by the foregoing emitter electrode 18L.

In the inverter 102, the collector electrode 16U of the IGBT element 12U is electrically connected to a high-potential power supply line 22 connected to the positive electrode of the direct current power supply 108. The emitter electrode 18L of the IGBT element 12L is electrically connected to a low-potential power supply line 24 (also referred to as ground line) connected to the negative electrode of the direct current power supply 108. The emitter electrode 18U of the IGBT element 12U and the collector electrode 16L of the IGBT element 12L are connected to an output line 26 for output from the inverter 102 to the motor 200.

In FIG. 1, "P" indicates the positive electrode of the high-potential power supply line 22, "N" indicates the negative electrode of the low potential power supply line 24, and "O" indicates the output of the output line 26. Gate terminals 28U and 28L are connected to the gate electrodes 20U and 20L, respectively.

The microcomputer 106 electrically connected to the gate terminals 28U and 28L via the driver 104 outputs driving signals (PWM signals) to the gate terminals 28U and 28L to control driving of the IGBT elements 12U and 12L. The microcomputer 106 includes a ROM that stores programs describing various types of control processing to be executed, a CPU that executes various types of arithmetic processing, a RAM that temporarily stores arithmetic processing results and various types of data, and other components.

The microcomputer 106 receives detection signals from not-shown current sensor, rotation sensor and the like, and generates driving signals for driving the motor 200 in accordance with torque command values received from the outside, and the foregoing detection signals received from the respective sensors. The six IGBT elements 12U and 12L of the inverter 102 are driven in accordance with the generated driving signals. As a result, driving currents are supplied from the direct current power supply 108 to the motor 200 via the inverter 102. With supply of the currents, the motor 200 is driven to generate desired driving torque. Alternatively, currents corresponding to power generated by the motor 200 are rectified by the inverter 102, and supplied for discharge of the direct current power supply 108.

Figure 5:
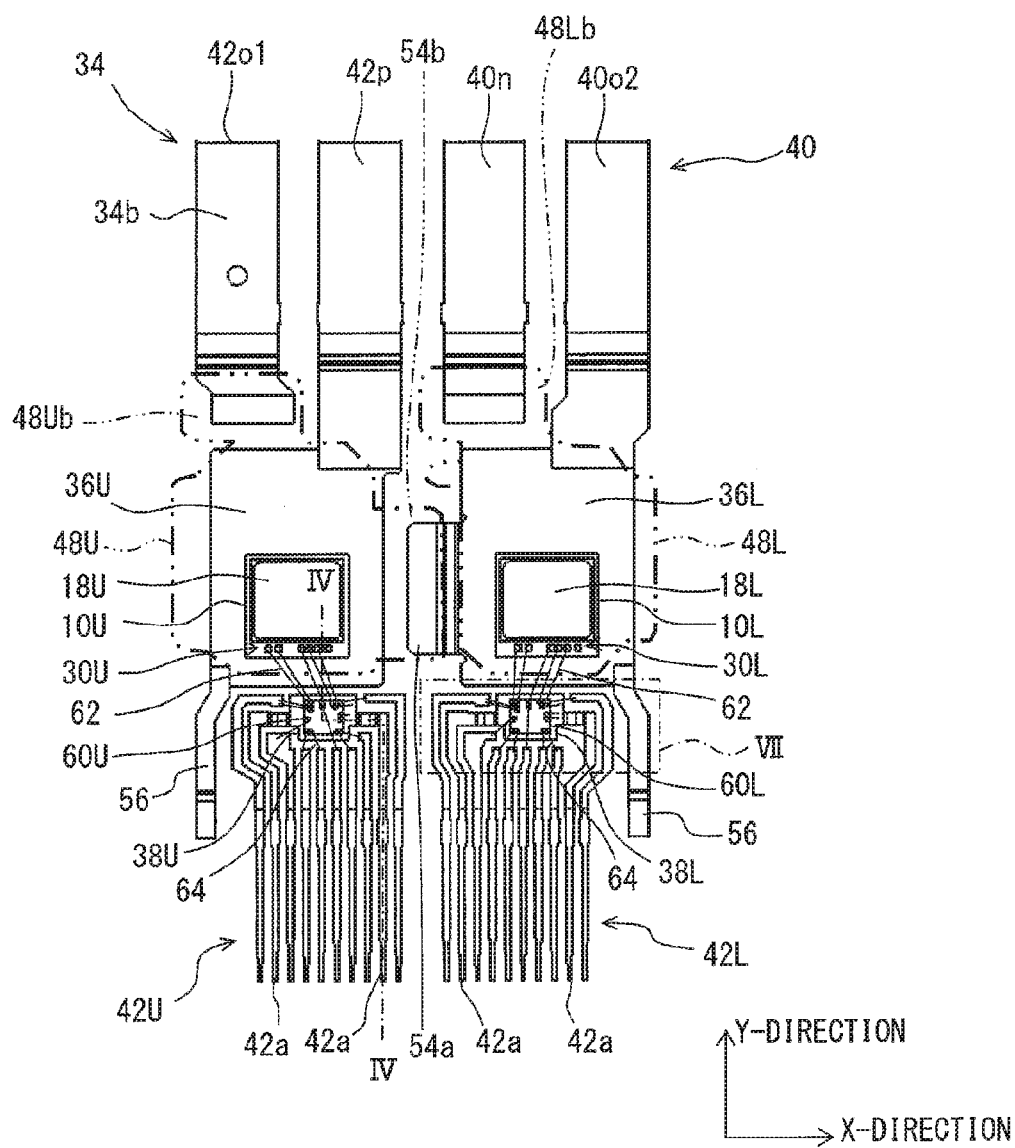
FIG. 5 is a plan view of the semiconductor device illustrated in FIG. 2, not showing a resin molding, and indicating second heat sinks by alternate long and two short dashes lines.
Figure 6:
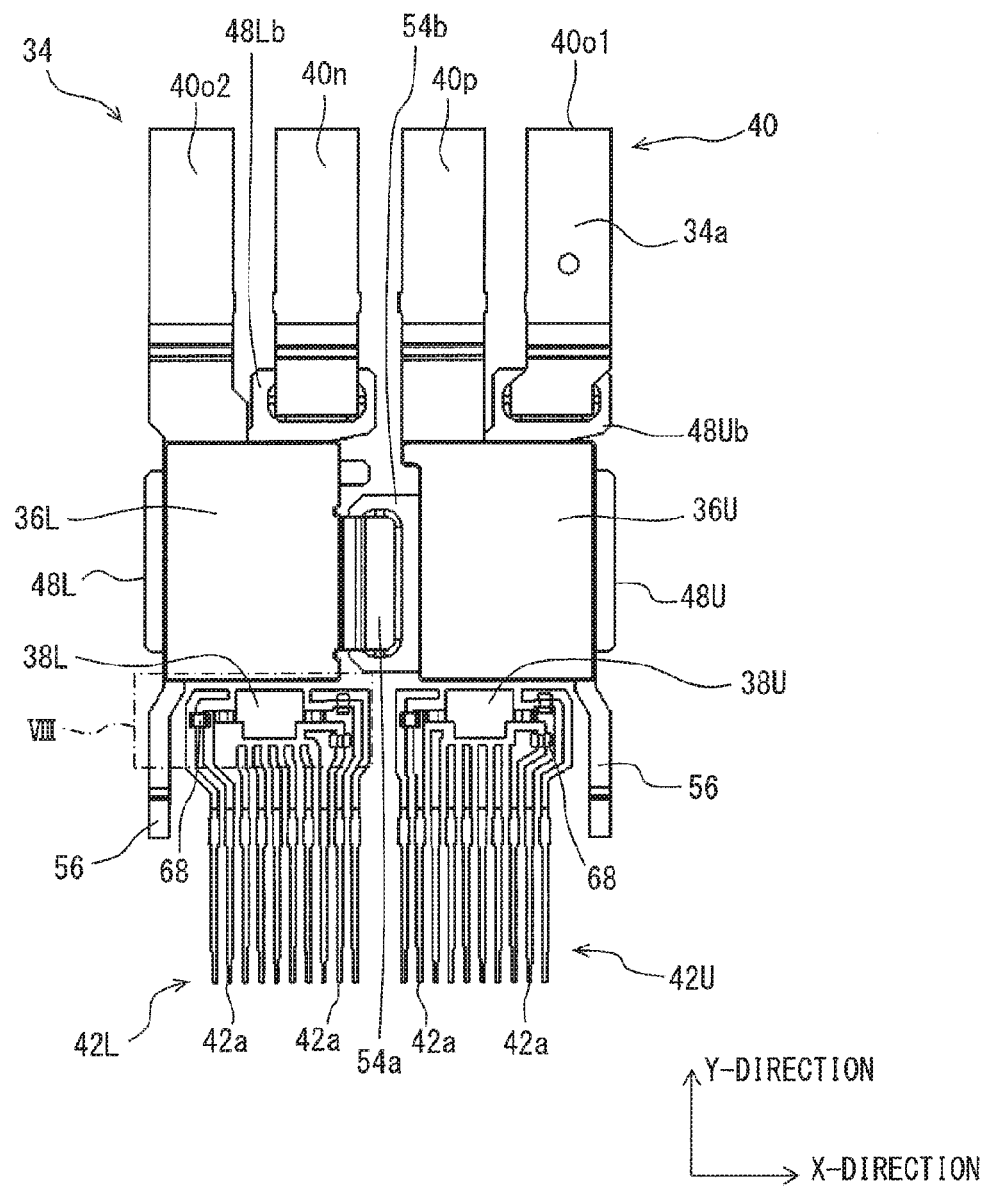
FIG. 6 is a plan view of the semiconductor device illustrated in FIG. 2, not showing the resin molding and bonding wires, as viewed from the lead frame side.

A general configuration of each of the semiconductor devices 10 is hereinafter described with reference to FIGS. 2 to 6. A line IV-IV in FIG. 5 corresponds to a line IV-IV in FIG. 2. FIG. 5 does not show a resin molding, and indicates second heat sinks by alternate long and two short dashes lines. FIG. 6 does not show the resin molding and bonding wires.

As described above, each of the semiconductor devices 10 includes two semiconductor chips: one of the semiconductor chips constituting the upper arm portion 10U; and the other semiconductor chip constituting the lower arm portion 10L. In other words, each of the semiconductor devices 10 is constituted by a so-called two-in-one package including the two IGBT elements 12U and 12L. The arm portions 10U and 10L correspond to first semiconductor chips.

The upper arm portion 10U includes the collector electrode 16U that is a first main electrode and is disposed on one surface of the upper arm portion 10U in the Z-direction. The upper arm portion 10U further includes the emitter electrode 18U that is a second main electrode paired with the first main electrode, and a control electrode 30U that includes the gate electrode 20U. Both the emitter electrode 18U and the control electrode 30U are disposed on a surface of the upper arm portion 10U on the side opposite to the collector electrode surface side. Similarly, the lower arm portion 10L includes the collector electrode 16L that is a high-potential side main electrode and disposed on one surface of the lower arm portion 10L in the Z-direction. The lower arm portion 10L further includes the emitter electrode 18L that is a lower potential side electrode, and a control electrode 30L including the gate electrode 20L. Both the emitter electrode 18L and the control electrode 30L are disposed on a surface of the lower arm portion 10L on the side opposite to the collector electrode surface side. According to this embodiment, each of the control electrodes 30U and 30L includes electrodes (pads) for temperature sensing, current sensing, and Kelvin emitter, in addition to the gate electrode 20U or 20L. Each of the arm portions 10U and 10L has a substantially rectangular planar shape approximately equivalent to each other, and has a thickness approximately equivalent to each other in the Z-direction. The arm portions 10U and 10L are disposed in a line in the X-direction, and disposed substantially at the same position in the Z-direction, i.e., disposed in parallel, with the respective collector electrode surfaces located on the same side.

As illustrated in FIGS. 2 to 6, the semiconductor device 10 includes a resin molding 32, a lead frame 34, terminals 46U and 46L, second heat sinks 48U and 48L, driver ICs 60U and 60L, and passive components 68, in addition to the arm portions 10U and 10L discussed above.

The resin molding 32 is made of a resin material having electric insulation properties. According to this embodiment, the resin molding 32 is molded from epoxy resin by transfer molding. The resin molding 32 has a substantially rectangular parallelepiped shape, and includes one surface 32a and a rear surface 32b on the side opposite to the one surface 32a in the Z-direction. Each of the one surface 32a and the rear surface 32b is a flat surface substantially parallel with a plane defined by the X-direction and the Y-direction. The arm portions 10U and 10L are sealed by the resin molding 32.

The lead frame 34 is constituted by a partially bent metal plate, and includes one surface 34a and a rear surface 34b on the side opposite to the one surface 34a in the Z-direction. The one surface 32a and the one surface 34a are disposed on the same side in the Z-direction, while the rear surfaces 32b and 34b are disposed on the same side in the Z-direction. The metal plate discussed above may be a single plate, or may be a plurality of pressure-bonded metal plates, for example.

The lead frame 34 is at least made of a metal material. For example, the lead frame 34 may be made of a metal material having excellent thermal conductivity and electric conductivity, such as copper, copper alloy, and aluminum alloy. The lead frame 34 includes first heat sinks 36U and 36L, islands 38U and 38L, main terminals 40, and control terminals 42U and 42L.

Each of the first heat sinks 36U and 36L performs a function for radiating heat generated from the corresponding arm portion 10U or 10L, and an electric connection function. The upper arm portion 10U provided at the portion of the first heat sink 36U on the rear surface 34b of the lead frame 34 is disposed such that the collector electrode surface faces the first heat sink 36U. The first heat sink 36U is connected to the collector electrode 16U via a solder 44. Similarly, the lower arm portion 10L provided on the first heat sink 36L is disposed such that the collector electrode surface faces the first heat sink 36L. The first heat sink 36L is electrically, mechanically, and thermally connected to the collector electrode 16L via the solder 44.

Each of the first heat sinks 36U and 36L has a substantially rectangular planar shape, and has a thickness approximately equivalent to each other. Each of the first heat sinks 36U and 36L has a larger size along the plane defined by the X-direction and the Y-direction than the size of the corresponding arm portion 10U or 10L to accommodate the arm portion 10U or 10L.

The rear surface 34b and the side surface facing the upper arm portion 10U in the portion of the first heat sink 36U are covered by the resin molding 32. On the other hand, the one surface 34a is exposed from the one surface 32a of the resin molding 32. More specifically, the one surface 34a is substantially flush with the one surface 32a. The flush state in this context refers to a state that two or more surfaces are positioned in the same plane without steps produced between these surfaces. Similarly, the rear surface 34b and the side surface facing the lower arm portion 10L in the portion of the first heat sink 36L are covered by the resin molding 32. On the other hand, the one surface 34a is exposed from the one surface 32a of the resin molding 32.

More specifically, the one surface 34a is substantially flush with the one surface 32a. According to this structure, the portions of the first heat sinks 36U and 36L contained in the one surface 34a of the lead frame 34 constitute exposed portions 36Ua and 36La exposed from the one surface 32a of the resin molding 32. In this case, the exposed portions 36Ua and 36La function as heat radiation surfaces. The solders 44 are also sealed by the resin molding 32.

The second heat sinks 48U and 48L are disposed on the arm portions 10U and 10L via the terminals 46U and 46L on the side opposite to the first heat sinks 36U and 36L in the Z-direction.

The terminals 46U and 46L are provided to secure predetermined clearances between the arm portions 10U and 10L and the second heat sinks 48U and 48L for connection of bonding wires 62 to the control electrodes 30U and 30L. The terminals 46U and 46L thermally and electrically relay the arm portions 10U and 10L with the second heat sinks 48U and 48L. Accordingly, it is preferable that the terminals 46U and 46L are made of a metal material having at least excellent thermal conductivity and electric conductivity.

Each of the terminals 46U and 46L has shape and size corresponding to those of the emitter electrode 18U or 18L. According to this embodiment, each of the terminals 46U and 46L has a rectangular parallelepiped shape. The upper arm side terminal 46U is so disposed as to face the emitter electrode 18U of the upper arm portion 10U, and connected to the emitter electrode 18U via a solder 50. Similarly, the lower arm side terminal 46L is so disposed as to face the emitter electrode 18L of the lower arm portion 10L, and connected to the emitter electrode 18L via the solder 50. The terminals 46U and 46L and the solders 50 are also sealed by the resin molding 32.

The upper arm side second heat sink 48U is connected to the surface of the upper arm side terminal 46U on the side opposite to the upper arm portion 10U via a solder 52. Similarly, the lower arm side second heat sink 48L is connected to the surface of the lower arm side terminal 46L on the side opposite to the lower arm portion 10L via the solder 52.

Similarly to the first heat sinks 36U and 36L, the second heat sinks 48U and 48L are at least made of a metal material to secure thermal conductivity and electric conductivity. For example, the second heat sinks 48U and 48L may be made of a metal material having excellent thermal conductivity and electric conductivity, such as copper, copper alloy, and aluminum alloy. The second heat sinks 48U and 48L have substantially the same thickness. The second heat sinks 48U and 48L have substantially the same shape and size as those of the first heat sinks 36U and 36L, respectively. Accordingly, the entire arm portions 10U and 10L are accommodated within opposed areas of the first heat sinks 36U and 36L and the second heat sinks 48U and 48L in the plane defined by the X-direction and the Y-direction.

The facing surface of the upper arm side second heat sink 48U facing the upper arm portion 10U (terminal 46U), and the side surface of the upper arm side second heat sink 48U are covered by the resin molding 32. On the other hand, the surface of the upper arm side second heat sink 48U on the side opposite to the facing surface is exposed from the rear surface 32b of the resin molding 32. Similarly, the facing surface of the second heat sink 48L facing the lower arm portion 10L (terminal 46L), and the side surface of the lower arm side second heat sink 48L are covered by the resin molding 32. On the other hand, the surface of the upper arm side second heat sink 48U on the side opposite to the facing surface is exposed from the rear surface 32b of the resin molding 32. According to this structure, the surfaces of the second heat sinks 48U and 48L on the side opposite to the arm portions 10U and 10L constitute exposed portions 48Ua and 48La exposed from the resin molding 32. In this case, the exposed portions 48Ua and 48La function as heat radiation surfaces. The exposed portions 48Ua and 48La are substantially flush with the rear surface 32b.

As illustrated in FIGS. 5 and 6, each of the second heat sinks 48U and 48L has a substantially rectangular planar shape. Two sides of the rectangular shape extend substantially in parallel with the X-direction, while the other two sides extend substantially in parallel with the Y-direction. A protrusion portion 48Ub protrudes in the Y-direction from one of the sides of the upper arm side second heat sink 48U extending substantially in parallel with the X-direction. Similarly, a protrusion portion 48Lb protrudes in the same direction as the protrusion direction of the protrusion portion 48Ub from the lower arm side second heat sink 48L. The protrusion portions 48Ub and 48Lb are portions electrically connected with a part of the plurality of main terminals 40. Each of the protrusion portions 48Ub and 48Lb has a smaller thickness than each thickness of the second heat sinks 48U and 48L, and is sealed by the resin molding 32.

Figure 3:
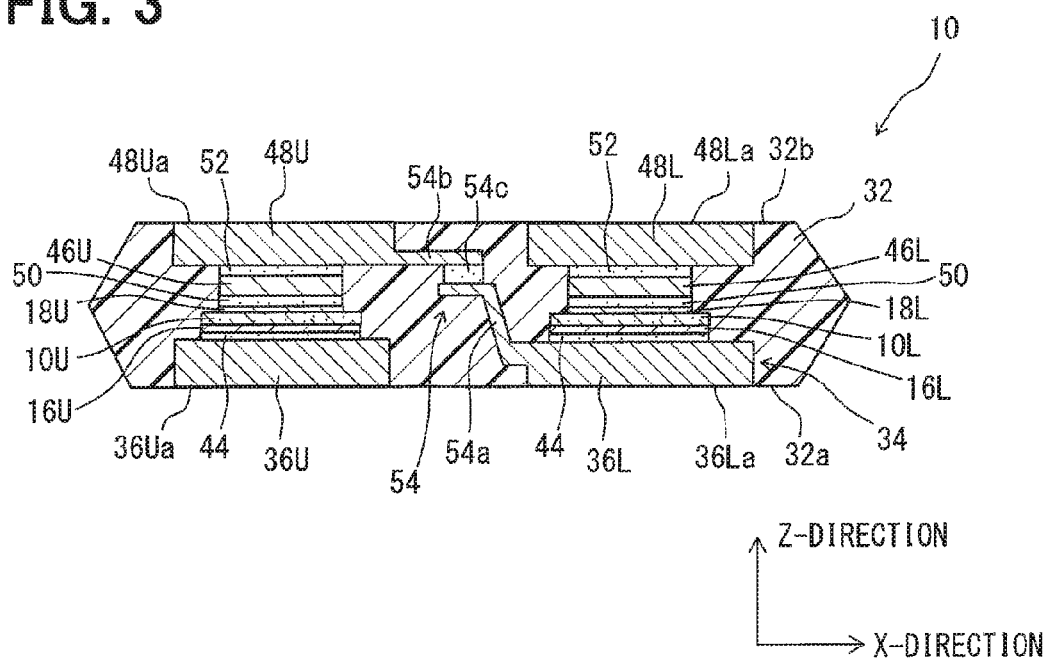
FIG. 3 is a cross-sectional view of the semiconductor device taken along a line in FIG. 2.

The lower arm side first heat sink 36L and the upper arm side second heat sink 48U are electrically connected to each other via a relay portion 54. According to this embodiment, a protrusion portion 54a protrudes toward the upper arm side from an upper arm side end of the first heat sink 36L in the X-direction. On the other hand, a protrusion portion 54b protrudes toward the lower arm side from a lower arm side end of the second heat sink 48U in the X-direction. The protrusion portions 54a and 54b are connected to each other via a solder 54c to constitute the relay portion 54. The relay portion 54 electrically connects the emitter electrode 18U of the IGBT element 12U and the collector electrode 16L of the IGBT element 12L to form the substantially N-shaped upper and lower arms as illustrated in FIG. 3.

The relay portion 54 is sealed by the resin molding 32. Presented in this embodiment is a configuration example of the second heat sink 48U side protrusion portion 54b extending in the X-direction. On the other hand, the first heat sink 36L side protrusion portion 54a extends in the X-direction, and bends at an intermediate portion to extend in the Z-direction as well.

The main terminals 40 of the lead frame 34 extend to the outside of the resin molding 32 from a side surface 32c of the resin molding 32 forming a substantially rectangular planar shape. According to this structure, a part of the main terminals 40 is sealed by the resin molding 32. The respective main terminals 40 are configured to extend in the Y-direction, and disposed in a line in the X-direction. The respective main terminals 40 are further bent at intermediate positions in the longitudinal direction to extend from positions between the one surface 32a and the rear surface 32b.

The main terminals 40 include a power supply terminal 40p, a ground terminal 40n, and output terminals 40o1 and 40o2. The power supply terminal 40p is a terminal for connecting the collector electrode 16U of the upper arm portion 10U to the high potential power supply line 22 (so-called P-terminal). As illustrated in FIGS. 5 and 6, the power supply terminal 40p is connected to the upper arm side first heat sink 36U, and extends in the Y-direction from one side of the first heat sink 36U having a substantially rectangular planar shape.

The ground terminal 40n is a terminal for connecting the emitter electrode 18L of the lower arm portion 10L to the low potential power supply line 24 (so-called N terminal).

The ground terminal 40n is disposed adjacent to the power supply terminal 40p. The ground terminal 40n is electrically connected to the protrusion portion 48Lb of the lower arm side second heat sink 48L via a not-shown solder.

The output terminal 40o1 is a terminal for connecting the emitter electrode 18U of the upper arm portion 10U to the output line 26 (so-called O terminal). The output terminal 40o1 is disposed adjacent to the power supply terminal 40p such that the power supply terminal 40p is sandwiched between the output terminal 40o1 and the ground terminal 40n. The output terminal 40o1 is electrically connected to the protrusion portion 48Ub of the upper arm side second heat sink 48U via a not-shown solder.

The output terminal 40o2 is a terminal for connecting the collector electrode 16L of the lower arm portion 10L to the output line 26 (so-called O terminal). The output terminal 40o2 is connected to the lower arm side first heat sink 36L, and extends in the Y-direction from one side of the first heat sink 36L forming a substantially rectangular planar shape.

The control terminals 42U and 42L extend to the outside of the resin molding 32 from a side surface 32d of the resin molding 32 on the side opposite to the side surface 32c. According to this structure, a part of the main terminals 40 is sealed by the resin molding 32. The respective control terminals 42U and 42L are configured to extend in the Y-direction, and disposed in a line in the X-direction. The respective main terminals 40 are further bent at intermediate positions in the longitudinal direction to extend in the Z-direction from positions between the one surface 32a and the rear surface 32b.

The upper arm side control terminal 42U includes terminals for temperature sensing, current sensing, Kelvin emitter, power supply, test mode setting, input for generating driving signals for the gate electrode 20U by the driver IC 60U, and error check, in addition to the upper arm side gate terminal 28U. A part of the plurality of the control terminals 42U are connected to the upper arm side island 38U. According to this embodiment, the ten control terminals 42U are provided in total. Two of the control terminals 42U are connected to the island 38U. More specifically, the second and ninth control terminals 42U in the X-direction are connected such that the island 38U is sandwiched between both ends of the second and ninth control terminals 42U in the X-direction.

Similarly, the lower arm side control terminal 42L includes terminals for temperature sensing, current sensing, Kelvin emitter, power supply, test mode setting, input for generating driving signals for the gate electrode 20L by the driver IC 60L, and error check, in addition to the upper and lower arm side gate terminal 28L. A part of the plurality of control terminals 42L are connected to the lower arm side island 38L. According to this embodiment, the ten control terminals 42L are provided in total. Two of the control terminals 42L are connected to the island 38L. More specifically, the second and ninth control terminals 42L in the X-direction are connected such that the island 38L is sandwiched between the second and ninth control terminals 42L in the X-direction. The control terminals 42U and 42L connected to the islands 38U and 38L are hereinafter referred to as connection terminals 42a.

Figure 2:
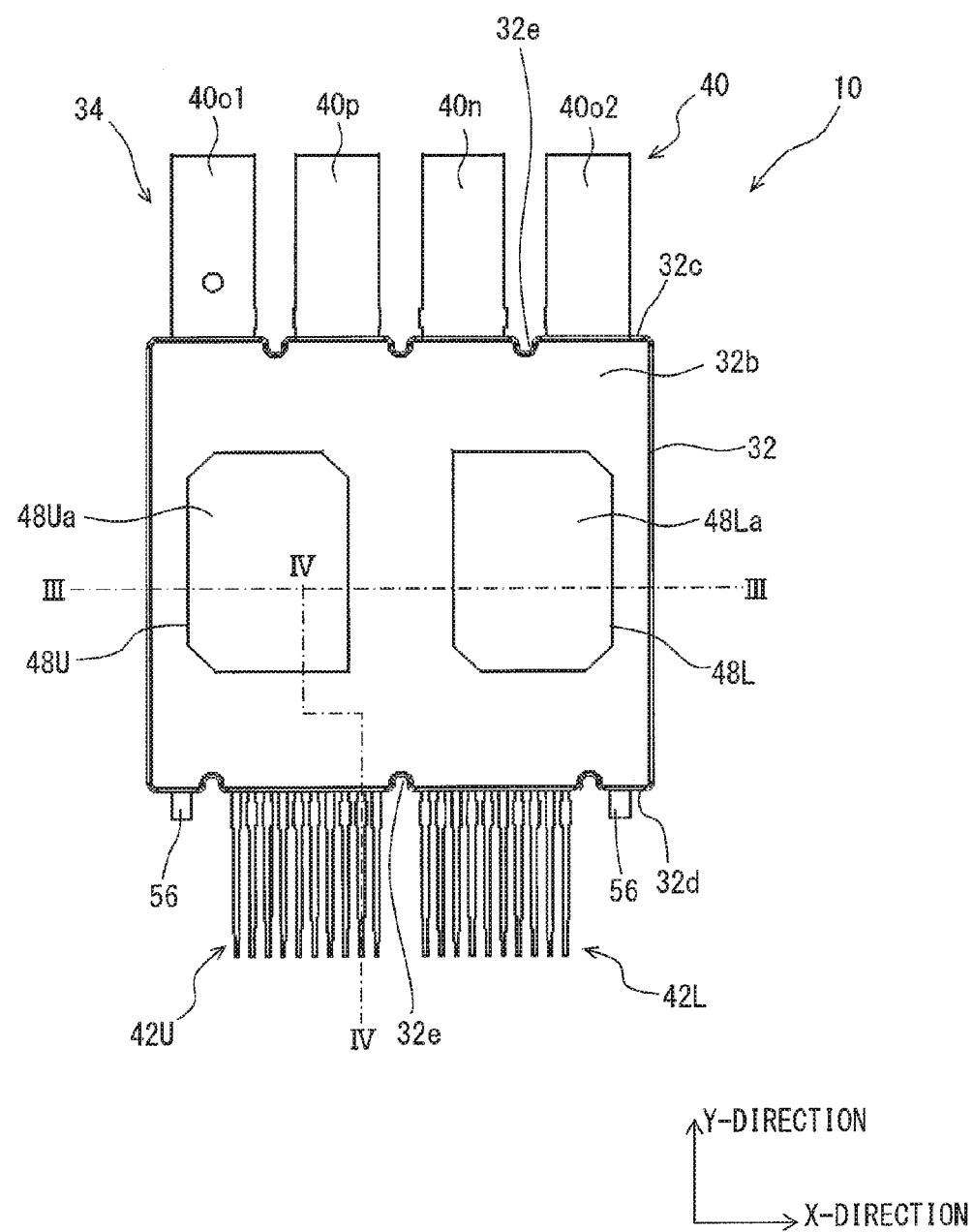
FIG. 2 is a plan view illustrating a general configuration of the semiconductor device.

Each of the islands 38U and 38L and the control terminals 42U and 42L has a substantially the same thickness. A component indicated by a reference number 56 in FIGS. 2, 5, and 6 is a suspension lead. The suspension lead 56 is a portion for connecting the first heat sinks 36U and 36L to an outer circumferential frame of the lead frame 34.

Each of the side surfaces 32c and 32d of the resin molding 32 includes a plurality of recesses 32e. Each of the recesses 32e of the side surface 32c is provided in a portion between an adjoining pair of the main terminals 40. The recesses 32e of the side surface 32d are provided in a portion between the control terminals 42U and 42L, and each of portions between the control terminals 42U and 42L and the suspension leads 56. The recesses 32e increase a creeping distance of insulation, for example.

The driver IC 60U is mounted on the upper arm side island 38U via a solder 58, for example. Similarly, the driver IC 60L is mounted on the lower arm side island 38L via the not-shown solder 58. The respective driver ICs 60U and 60L constitute the driver 104. Each of the driver ICs 60U and 60L includes a single-side electrode element such as MOSFET on a semiconductor chip to control driving of an element provided on the corresponding arm portion 10U or 10L. Each thickness of the driver ICs 60U and 60L is larger than each thickness of the arm portions 10U and 10L. The driver ICs 60U and 60L correspond to second semiconductor chips.

Electrodes (pads) are provided on the surfaces of the driver ICs 60U and 60L on the side opposite to the islands 38U and 38L. The bonding wires 62 are connected to these electrodes. The control electrodes 30U and 30L of the arm portions 10U and 10L are connected to the driver ICs 60U and 60L, respectively, via the bonding wires 62. The bonding wires 62 correspond to first bonding wires. The driver ICs 60U and 60L are connected to the control terminals 42U and 42L, respectively, via bonding wires 64. The bonding wires 64 correspond to second bonding wires.

Figure 4:
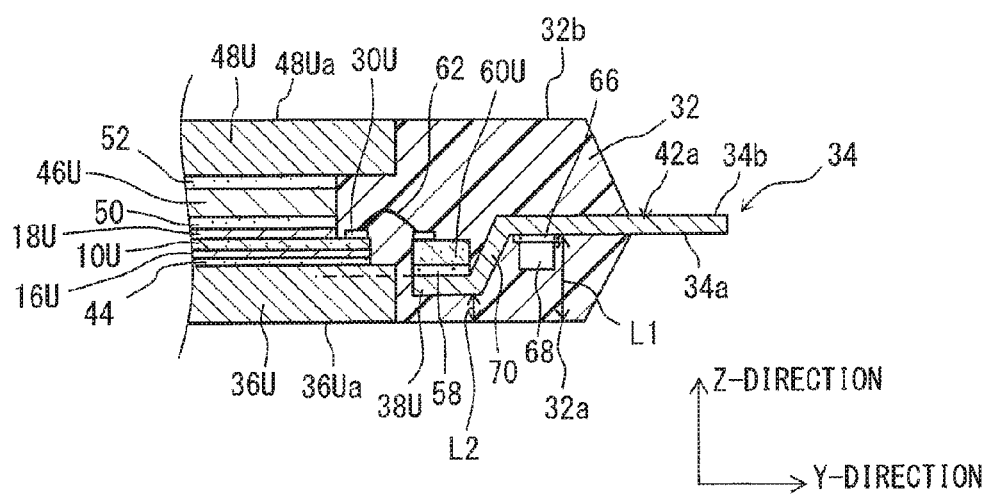
FIG. 4 is a cross-sectional view of the semiconductor device taken along a line IV-IV in FIG. 2.

As illustrated in FIGS. 4 and 6, the passive components 68 such as a chip resistance and a chip capacitor are mounted on the control terminals 42U and 42L via bonding materials 66. Each of the passive components 68 is so mounted as to electrically connect the plurality of control terminals 42U or 42L on the corresponding arm. According to this embodiment, each of the passive components 68 is a two-terminal chip component, and so mounted as to bridge the adjoining two control terminals 42U or 42L as illustrated in FIG. 6. More specifically, each of the passive components 68 is so mounted as to bridge a connection terminal 42a and the control terminal 42U or 42L disposed adjacent to the connection terminal 42a.

The passive components 68 are mounted to reduce noise transmitted from the control terminals 42U and 42L to the driver ICs 60U and 60L, for example. Accordingly, it is preferable that the passive components 68 mounted on the control terminal 42U and 42L are located in the vicinity of the driver ICs 60U and 60L.

Each of the passive components 68 has a small coating area of the bonding material 66. When a fluxless solder is used for the bonding material 66, the solder is difficult to wet-spread through an electrode of the passive component 68. Accordingly, the bonding material 66 may be made of a material providing bonding when heated in a second reflow step, such as a solder containing flux and Ag paste. The bonding material 66 of this type generates not a small amount of flux, outgas, fume, or other scatterings when heated. According to this embodiment, the bonding material 66 is constituted by a solder containing flux. On the other hand, the solders 44, 50, 52, and 58 of the semiconductor device 10 bonded before wire bonding are constituted by fluxless solders.

The semiconductor device 10 thus constructed is cooled by coolers each of which includes a refrigerant flow path. More specifically, coolers are disposed on both sides of the semiconductor device 10 in the Z-direction to cool the semiconductor device 10 from both the surfaces 32a and 32b sides. An insulation sheet is attached to each of the one surface 32a and the rear surface 32b of the resin molding 32 in a manner covering the exposed portions 36Ua, 36La, 48Ua, and 48La. The semiconductor device 10 is sandwiched between the coolers via the insulation sheets.

Figure 7:
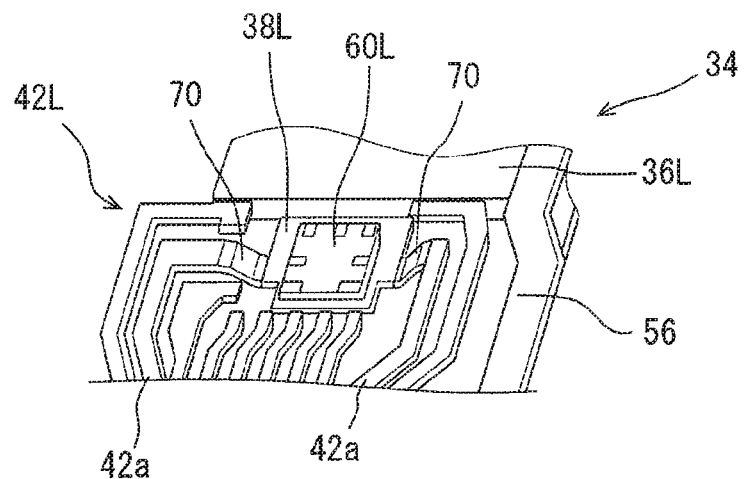
FIG. 7 is a perspective view illustrating an enlarged area VII indicated by an alternate long and short dash line in FIG. 5.
Figure 8:
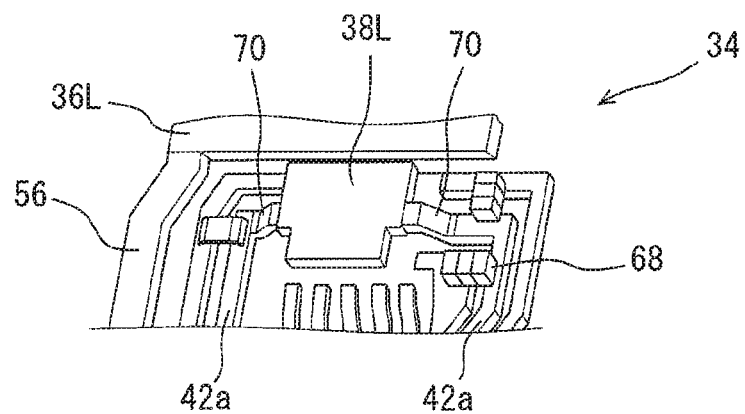
FIG. 8 is a perspective view illustrating an enlarged area VIII indicated by an alternate long and short dash line in FIG. 6.

A structure of an area around the islands 38U and 38L is hereinafter described with reference to FIGS. 4, 7, and 8.

The lead frame 34 is formed by punching a metal plate into a predetermined shape, and bending a part of the punched shape. More specifically, the islands 38U and 38L are depressed to reduce a step formed between the control electrode surfaces of the arm portions 10U and 10L and the electrode surfaces of the driver ICs 60U and 60L in the Z-direction as much as possible.

According to a comparison made in view of the position of the rear surface 34b in the Z-direction, the islands 38U and 38L are depressed such that the portions of the islands 38U and 38L are located closer to the one surface 32a of the resin molding 32 than the portions of the first heat sinks 36U and 36L and the passive component mounting portions of the control terminals 42U and 42L are. More specifically, the portions of the islands 38U and 38L on the rear surface 34b are depressed toward the one surface 32a of the resin molding 32 with respect to the portions of the first heat sinks 36U and 36L and the passive component mounting portions of the control terminals 42U and 42L.

In particular, in this embodiment, the control electrode surfaces of the arm portions 10U and 10L are substantially flush with the electrode surfaces of the driver ICs 60U and 60L in the Z-direction as a result of bending as can be seen from illustration of the upper arm side in FIG. 4 by way of example. Moreover, each of the connection terminals 42a includes a bent portion 70 between the connection end of the connection terminal 42a connecting with the islands 38U and 38L and the passive component mounting portion of the connection terminal 42a to depress the islands 38U and 38L toward the one surface 32a as illustrated in FIGS. 7 and 8.

The passive components 68 are mounted on the control terminals 42U and 42L on the one surface 34a of the lead frame 34. The distance between the one surface 34a of the lead frame 34 and the one surface 32a of the resin molding 32 in the Z-direction is determined such that a distance L1 at the passive component mounting portions of the control terminals 42U and 42L is longer than a distance L2 at the islands 38U and 38L. In this case, a sufficient clearance is securable between the passive components 68 and the one surface 32a of the resin molding 32 even in the structure of the passive components 68 mounted on the one surface 34a.

Figure 11:
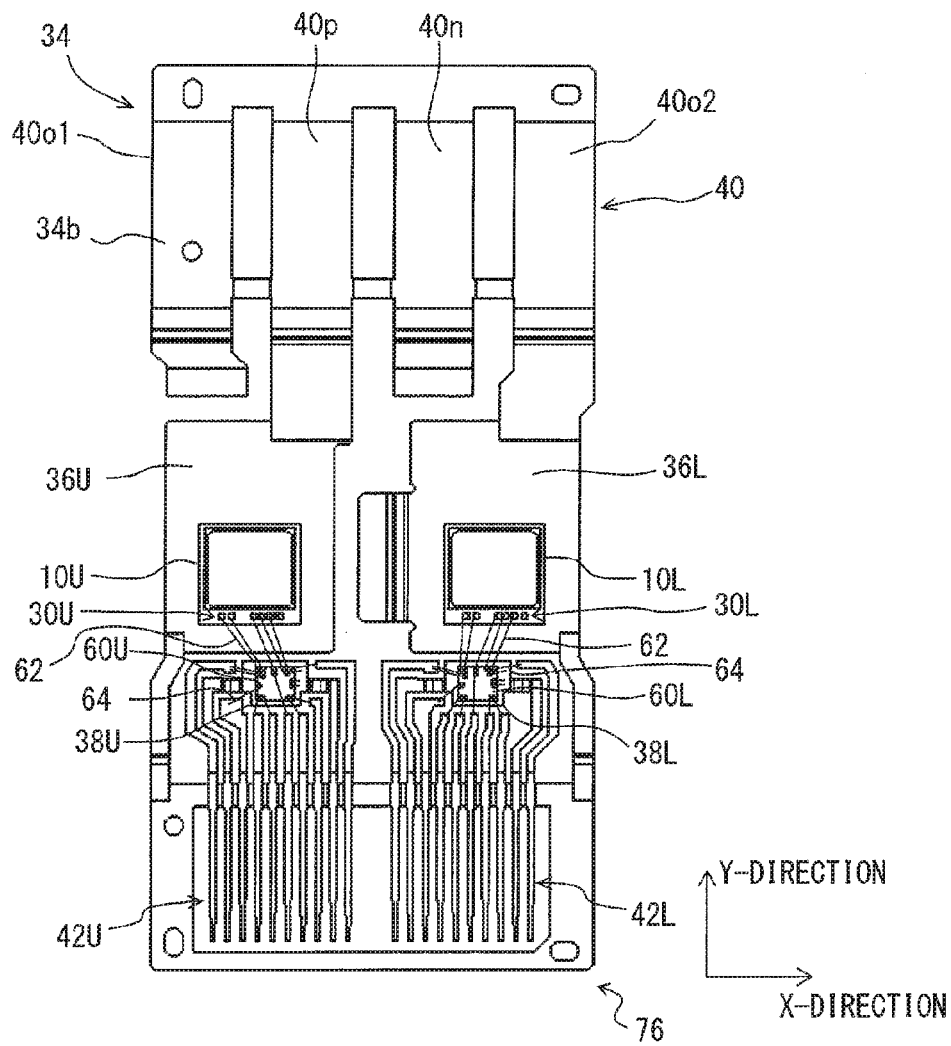
FIG. 11 is a plan view illustrating the method for manufacturing the semiconductor device, showing a state after completion of a bonding step.
Figure 12:
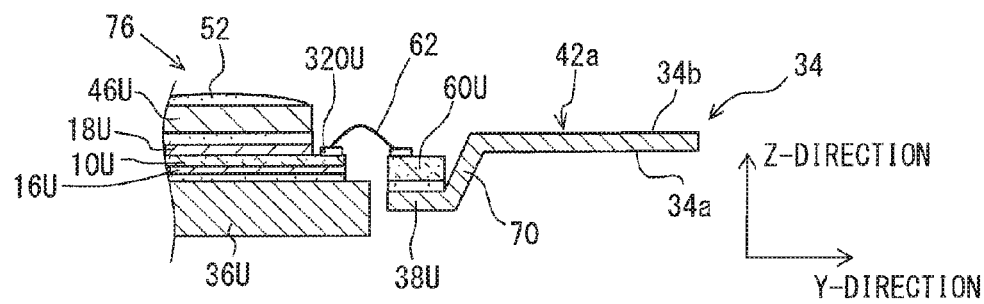
FIG. 12 is a cross-sectional view illustrating the state after completion of the bonding step.
Figure 13:
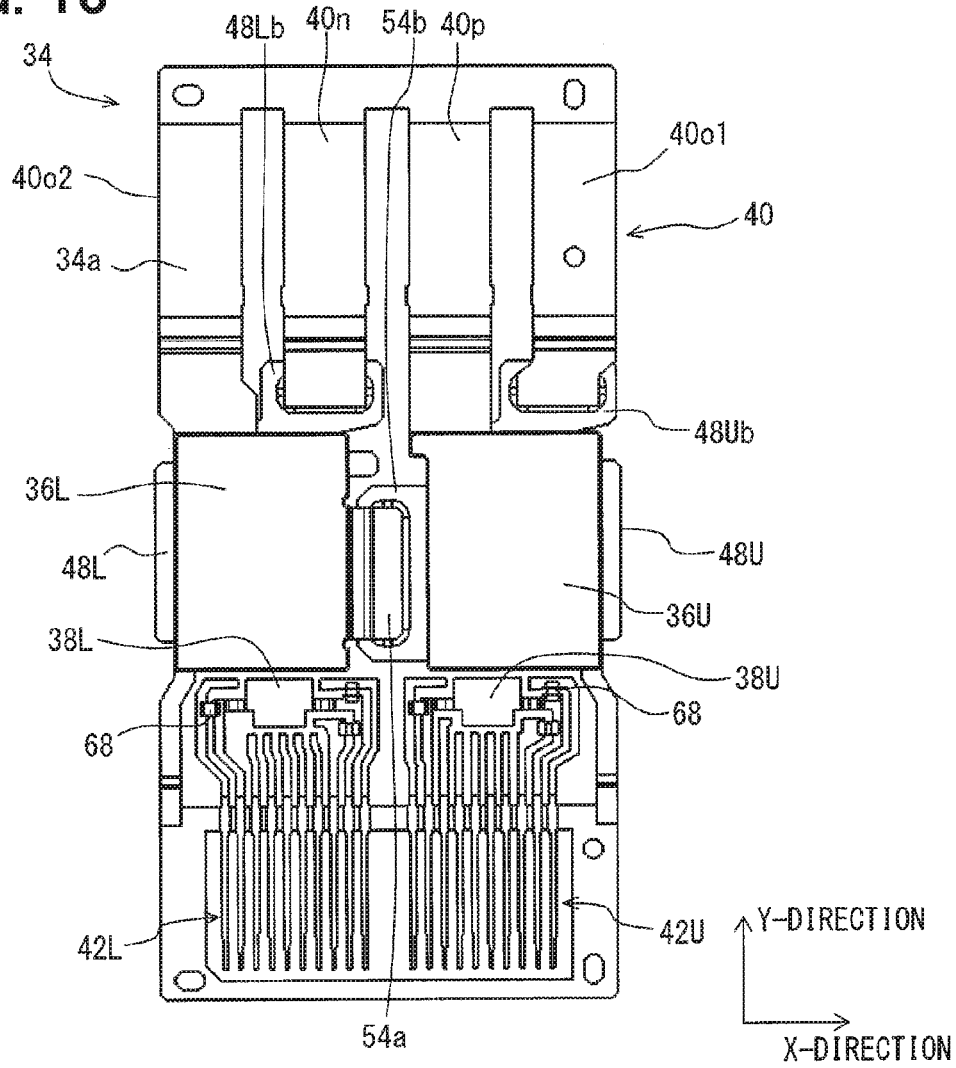
FIG. 13 is a plan view illustrating the method for manufacturing the semiconductor device, showing a state after completion of a second reflow step.

A method for manufacturing the semiconductor device 10 described above is hereinafter described with reference to FIGS. 9 to 14. FIG. 13 does not show the bonding wires 62 and 64.

Initially, respective elements constituting the semiconductor device 10 are prepared. More specifically, the respective arm portions 10U and 10L, the lead frame 34, the terminals 46U and 46L, the second heat sinks 48U and 48L, the driver ICs 60U and 60L, and the passive components 68 are prepared.

Figure 9:
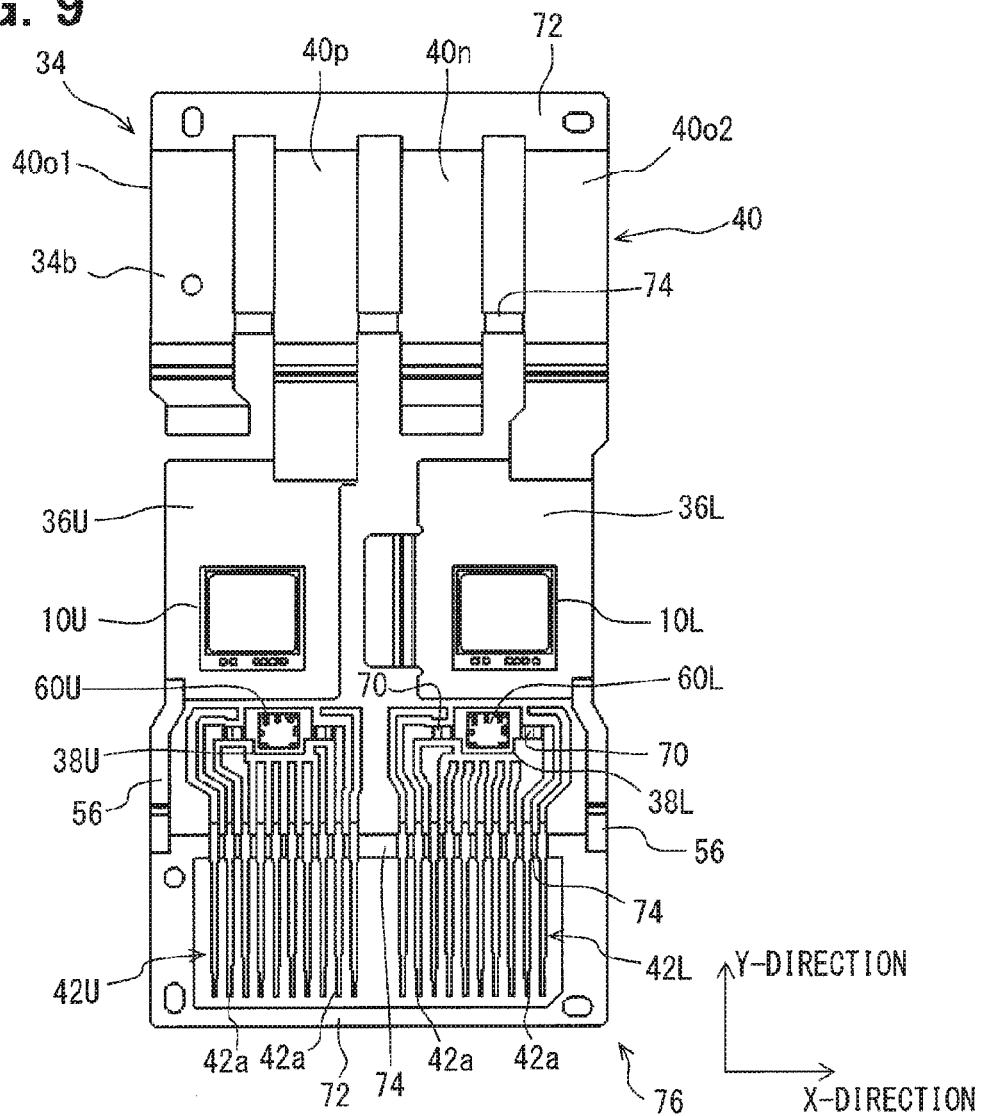
FIG. 9 is a plan view illustrating a method for manufacturing the semiconductor device, showing a state after completion of a first reflow step.
Figure 10:
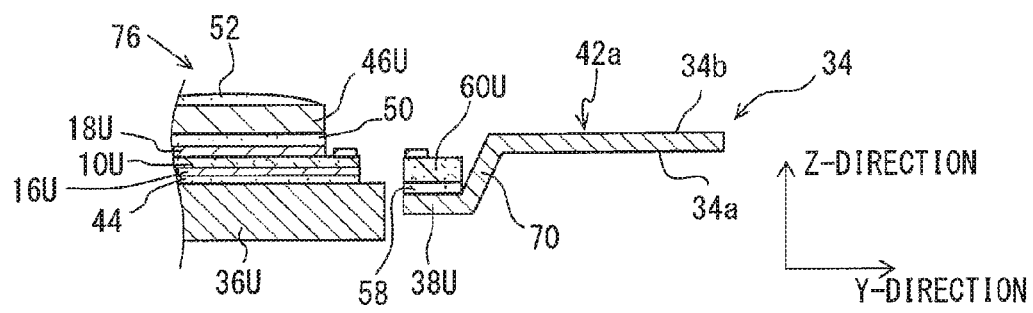
FIG. 10 is a cross-sectional view illustrating the state after completion of the first reflow step, as a view corresponding to FIG. 4.

In this case, the lead frame 34 to be prepared includes the first heat sinks 36U and 36L, the islands 38U and 38L, the main terminals 40, and the control terminals 42U and 42L as one piece body as illustrated in FIGS. 9 and 10. In addition, the lead frame 34 to be prepared is bent such that the portions of the islands 38U and 38L are located closer to the one surface 32a of the resin molding 32 on the rear surface 34b than the portions of the first heat sinks 36U and 36L and the passive component mounting portions of the control terminals 42U and 42L are. In other words, the lead frame 34 to be prepared is bent such that steps in the Z-direction between the control electrode surfaces of the arm portions 10U and 10L and the electrode surfaces of the driver ICs 60U and 60L become the smallest possible lengths. In particular, in this embodiment, the lead frame 34 to be prepared is bent such that substantially no step is produced between these portions.

The lead frame 34 having this structure is formed by a bending process in which the islands 38U and 38L are pressed downward from the rear surface 34b with respect to the first heat sinks 36U and 36L and the passive component mounting portions of the control terminals 42U and 42L. According to this embodiment, the lead frame 34 having this structure is formed by bending the portions of the connection terminals 42a between the connection ends connected with the islands 38U and 38L and the passive component mounting portions. The bent portions of the connection terminals 42a become the bent portions 70 discussed above. A component indicated by a reference number 72 in FIG. 9 is an outer circumferential frame of the lead frame 34, while a component indicated by a reference number 74 in FIG. 9 is a tie-bar.

Subsequently, a first reflow step is performed. In the first reflow step, reflow is carried out for the solders 44 interposed between the respective arm portions 10U and 10L and the corresponding first heat sinks 36U and 36L, and the solders 50 interposed between the respective arm portions 10U and 10L and the corresponding terminals 46U and 46L. In addition, reflow is also carried out for the solders 58 interposed between the respective driver ICs 60U and 60L and the corresponding islands 38U and 38L. As a result, a connection body 76 constituted by the lead frame 34, the arm portions 10U and 10L, the terminals 46U and 46L, and the respective driver ICs 60U and 60L as one piece body is produced as illustrated in FIG. 9.

According to this embodiment, the solders 50 and 52 are soldered beforehand (soldering beforehand) on both the surfaces of each of the terminals 46U and 46L in the preparatory step discussed above. A sufficiently large amount of the solders 52 are disposed to absorb tolerance variations in the height of the semiconductor device 10.

Subsequently, the solder 44 having a foil shape, for example, is disposed on each of the portions of the first heat sinks 36U and 36L on the rear surface 34b of the lead frame 34. The arm portions 10U and 10L are disposed on the solders 44 such that the collector electrodes 16U and 16L face the solders 44. The terminals 46U and 46L are further disposed in such a condition as to face the emitter electrodes 18U and 18L of the arm portions 10U and 10L, respectively. On the other hand, the solder 58 having a foil shape, for example, is disposed on each of the portions of the islands 38U and 38L on the rear surface 34b of the lead frame 34. The driver ICs 60U and 60 are disposed on the solders 58. Reflow is carried out for the solders 44, 50, 52, and 58 in this laminated state. Each of the solders 52 has an elevated shape with a top located at the center of the terminal 46U or 46L by surface tension before the second heat sink 48U or 48L as a connection target is formed.

In this case, each or the solders 44, 50, 52, and 58 is constituted by a fluxless solder. Accordingly, scattering such as flux, outgas, and fume are not generated during the first reflow step. It is preferable that each of the solders 58 is constituted by a solder not fused during a second reflow step described below. According to this structure, a drop of the driver ICs 60U and 60L is more securely avoidable at the time of reverse of the connection body 76. However, each of the solders 58 may be constituted by a solder fused during the second reflow step similarly to the solders 44, 50, and 52. Even fused, the solders 58 retain high viscosity. In addition, the solders 58 are supported by the bonding wires 62. Accordingly, the solders 58 of this type similarly prevent a drop of the driver ICs 60U and 60L.

Subsequently, a wire bonding step is performed. As illustrated in FIGS. 11 and 12, the control electrodes 30U and 30L of the arm portions 10U and 10L are connected to the respective electrodes of the driver ICs 60U and 60L via the bonding wires 62. Similarly, the electrodes of the driver ICs 60U and 60L are connected to the respective control terminals 42U and 42L via the bonding wires 64.

According to the structure including the lead frame 34 constructed as above, the steps between the control electrode surfaces of the arm portions 10U and 10L and the electrode surfaces of the driver ICs 60U and 60L in the Z-direction decrease. In particular, in this embodiment, the control electrode surfaces of the arm portions 10U and 10L are substantially flush with the electrode surfaces of the driver ICs 60U and 60L in the Z-direction. Accordingly, connection failure of the bonding wires 62 due to the steps decreases. Moreover, in a state of substantially no step produced in the Z-direction, the arm portions 10U and 10L are allowed to come close to the driver ICs 60U and 60L in the Y-direction even when a connection angle of each of the wires 62 is set to an ideal range approximately from 40° to 50°. Accordingly, the size of the semiconductor device 10 does not increase in the Y-direction.

Furthermore, scatterings such as flux, outgas, and fume are not produced during the first reflow step. Accordingly, connection failure of the bonding wires 62 and 64 also decreases in this point.

Figure 14:
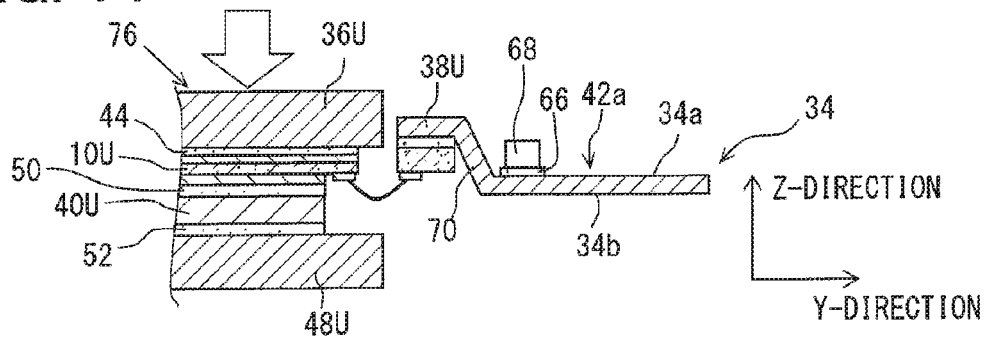
FIG. 14 is a cross-sectional view illustrating the state after completion of the second reflow step.

Subsequently, the second reflow step is performed. In the second reflow step, the connection body 76 is disposed on the second heat sinks 48U and 48L such that the terminals 46U and 46L face the respective second heat sinks 48U and 48L via the solders 52 as illustrated in FIGS. 13 and 14. More specifically, the connection body 76 is reversed from the state of the first reflow step (and wire bonding step), and disposed on the second heat sinks 48U and 48L. In this case, a solder 54c is disposed on the protrusion portion 54a constituting the relay portion 54, and the protrusion portion 54b is overlapped on the solder 54c. In addition, the bonding material 66 such as a solder containing flux is disposed at a predetermined value of each of the control terminals 42U and 42L, and the passive components 68 are disposed on the bonding materials 66.

Thereafter, reflow is carried out for the solders 44, 50, 52, and 54c. In this case, a not-shown jig may be used to connect the connection body 76 and the second heat sinks 48U and 48L while maintaining predetermined distances between the first heat sinks 36U and 36L and the exposed portions of the second heat sinks 48U and 48L. According to this embodiment, reflow is also carried out for the bonding materials 66 to mount the passive components 68 on the portions of the control terminals 42U and 42L on the one surface 34a of the lead frame 34. This reflow may be carried out with pressure applied from the first heat sinks 36U and 36L side.

Subsequently, a molding step is performed to mold the resin molding 32. While not shown in the figures, a connection structure obtained in the second reflow step is disposed in a not-shown metal mold. Thereafter, resin is injected into a cavity of the metal mold to mold the resin molding 32. According to this embodiment, the resin molding 32 is molded from epoxy resin by transfer molding.

After the molding step, a cutting step is performed as necessary. Thereafter, the outer circumferential frame 72 and the tie-bar 74 of the lead frame 34 are removed to produce the semiconductor device 10. The unnecessary portions may be removed before the cutting step. The cutting step may include cutting the one surface 32a and the rear surface 32b of the resin molding 32 to smooth the surfaces 32a and 32b, or cutting the heat sinks 36U, 36L, 48U, and 48L as well as the resin molding 32 to smooth the one surface 32a and the rear surface 32b together with the exposed portions 36Ua, 36La, 48Ua, and 48La.

According to this embodiment, the cutting step is performed after the molding step. In this case, the heat sinks 36U, 36L, 48U, and 48L are cut simultaneously with the cutting of the resin molding 32 to smooth the one surface 32a and the rear surface 32b together with the exposed portions 36Ua, 36La, 48Ua, and 48La. Accordingly, the exposed portions 36Ua and 36La become substantially flush with the one surface 32a, while the exposed portions 48Ua and 48La become substantially flush with the rear surface 32b.

Advantageous effects of the semiconductor device 10 and the method for manufacturing the semiconductor device 10 are hereinafter described.

There are shape limitations to the bonding wires 62. Connection failure decreases when the connection angle is set in a range approximately from 40° to 50°. When a large step is produced between the control electrode surfaces of the arm portions 10U and 10L and the electrode surfaces of the driver ICs 60U and 60L in the Z-direction, the control electrode surfaces and the electrode surfaces need to be disposed away from each other in the Y-direction for connection at a predetermined connection angle. In this case, the size of the semiconductor device 10 in the Y-direction increases.

According to this embodiment, however, the lead frame 34 is bent such that the portions of the islands 38U and 38L on the rear surface 34b of the lead frame 34 are located closer to the one surface 32a of the resin molding 32 than the portions of the heat sinks 36U and 36L are. This structure positions the connection surfaces of the bonding wires 62 close to the arm portions 10U and 10L and the driver ICs 60U and 60L in the Z-direction. In other words, the steps produced between the control electrode surfaces of the arm portions 10U and 10L and the electrode surfaces of the driver ICs 60U and 60L decrease. Accordingly, the size of the semiconductor device 10 in the Y-direction does not increase.

In addition, the control electrode surfaces of the arm portions 10U and 10L are located close to the electrode surfaces of the driver ICs 60U and 60L in the Z-direction, and thus failure at the time of connection of the bonding wires 62 also decreases. Furthermore, the control electrode surfaces of the arm portions 10U and 10L are located close to the electrode surfaces of the driver ICs 60U and 60L in both the Z-direction and the Y-direction, and thus the connection length of the bonding wires 62 decreases. Accordingly, failure caused when the bonding wires 62 are pressed by resin during the forming step decreases.

The driver ICs 60U and 60L are mounted on the rear surface 34b of the lead frame 34, while the passive components 68 are mounted on the one surface 34a. Accordingly, connection failure of the bonding wires 62 and 64 caused by scatterings such as flux decreases even when the bonding materials 66 of the passive components 68 are made of solder containing flux, Ag paste or the like.

The lead frame 34 used herein is bent such that the portions of the islands 38U and 38L on the rear surface 34b of the lead frame 34 are located closer to the one surface 32a of the resin molding 32 than the passive component mounting portions of the control terminals 42U and 42L are. In this case, the distance between the one surface 34a of the lead frame 34 and the one surface 32a of the resin molding 32 in the Z-direction is determined such that the length L1 at the passive component mounting portions of the control terminals 42U and 42L becomes longer than the distance L2 at the islands 38U and 38L. According to this structure, a predetermined clearance is securable between the one surface 32a and the passive components 68. Accordingly, exposure of the passive components 68 from the resin molding 32, and generation of entrainment voids or the like resulting from decrease in the thickness of resin covering the passive components 68 decrease. This structure therefore allows mounting of the passive components 68 on the one surface 34a side of the lead frame 34.

Particularly in case of this embodiment, the one surface 34a of the lead frame 34 is positioned above the rear surface 34b by reverse of the connection body 76 in the second reflow step. This structure allows positioning of the passive components 68 on the control terminals 42U and 42L of the reversed connection body 76 on the one surface 34a via the bonding materials 66. Mounting of the passive components 68 is executed by heating during the second reflow step. Accordingly, mounting of the passive components 68 is achievable in the second reflow step without the necessity of an additional manufacturing step. Moreover, the passive components 68 are mounted after the wire bonding step, and thus connection failure of the bonding wires 62 and 64 caused by scatterings such as flux is more securely avoidable.

The control electrode surfaces of the arm portions 10U and 10L are substantially flush with the electrode surfaces of the driver ICs 60U and 60L in the Z-direction. In this case, substantially no step is produced between the connection surfaces of the bonding wires 62, and thus increase in size is more effectively avoidable. Moreover, connection failure of the bonding wires 62 caused by steps between these portions more effectively decreases. Furthermore, failure caused when the bonding wires 62 are pressed by resin during the molding step more effectively decreases.

When the electrode surfaces of the driver ICs 60U and 60L are located closer to the second heat sinks 48U and 48L than the control electrode surfaces of the arm portions 10U and 10L are with large steps produced between these surfaces, the bonding wires 62 may contact the second heat sinks 48U and 48L and cause connection failure. For avoiding this difficulty, large clearances between the second heat sinks 48U and 48L and the arm portions 10U and 10L are needed. In this case, size reduction in the Z-direction becomes difficult. According to this embodiment, however, the control electrode surfaces of the arm portions 10U and 10L are substantially flush with the electrode surfaces of the driver ICs 60U and 60L in the Z-direction. Accordingly, the size in the Z-direction decreases while avoiding contact between the bonding wires 62 and the second heat sinks 48U and 48L.

According to this embodiment, the exposed portions 36Ua and 36La of the first heat sinks 36U and 36L are exposed from the one surface 32a of the resin molding 32. Accordingly, heat generated from the arm portions 10U and 10L is efficiently radiated to the outside of the semiconductor device 10, Particularly in case of this embodiment, the exposed portions 36Ua and 36La are substantially flush with the one surface 32a, while the exposed portions 48Ua and 48La are substantially flush with the rear surface 32b. Moreover, the exposed portions 36Ua and 36La are substantially in parallel with the exposed portions 48Ua and 48La. Accordingly, efficient heat radiation is achievable for the coolers disposed on both sides of the semiconductor device 10.

According to this embodiment, only a part of the connection terminals 42a of the plurality of control terminals 42U and 42L are connected to the islands 38U and 38L. Each of the connection terminals 42a includes the bent portion 70 between the connection end of the connection terminal 42a connecting with the island 38U or 38L and the passive component mounting portion for mounting the passive component 68 to depress the island 38U or 38L. For example, when bent portions are formed in portions different from the control terminals 42U and 42L of the lead frame 34, such as suspension leads, the control terminals 42U and 42L and the first heat sinks 36U and 36L are required to be disposed in portions other than the suspension leads. According to this embodiment, however, the foregoing structure of the semiconductor device 10 decreases the size of the semiconductor device 10.

While a preferred embodiment of the present disclosure has been described, the present disclosure is not limited to this embodiment in any sense. Various modifications may be made without departing from the scope of the present disclosure.

According to this embodiment, the semiconductor device 10 includes the terminals 46U and 46L. However, the terminals 46U and 46L may be eliminated. For example, protrusions corresponding to the terminals may be provided on the second heat sinks 48U and 48L.

According to this embodiment, the main terminals 40 include the two output terminals 40o1 and 40o2. However, the main terminals 40 may include only either the output terminal 40o1 or 40o2, i.e., only a single output terminal.

Discussed in this embodiment has been an example of a two-in-one package which seals the two arm portions 10U and 10L of the six arm portions 10U and 10L of the three-phase inverter by using the resin molding 32. However, a one-in-one package which seals the single arm portion 10U or 10L by the resin molding 32, or a six-in-one package which seals the six arm portions 10U and 10L by the resin molding 32 may be adopted.

According to this embodiment, the heat sinks 36U, 36L, 48U, and 48L include the exposed portions 36Ua, 36La, 48Ua, and 48La, respectively. However, a structure in which the heat sinks 36U, 36L, 48U, and 48L are completely sealed by the resin molding 30, i.e., a structure in which the exposed portions 36Ua, 36La, 48Ua, and 48La are covered with the resin molding 32 may be adopted.

The invention claimed is:
1. A semiconductor device comprising:
a single lead frame that includes
one surface and a rear surface opposite to the one surface, and further includes
a first heat sink, an island, and a control terminal, the island and the control terminal being separated from the first heat sink;
a first semiconductor chip that includes
a first main electrode arranged at a facing surface of the first semiconductor chip facing the rear surface, and further includes a control electrode and a second main electrode, the second main electrode paired with the first main electrode, the control electrode and the second main electrode being arranged at a surface of the first semiconductor chip opposite to the facing surface, the first main electrode being connected to the first heat sink;

a second heat sink arranged opposed to the surface of the first semiconductor chip at which the control electrode is arranged, the second heat sink being connected to the second main electrode;

a second semiconductor chip fixed to the island at the rear surface to control driving of the first semiconductor chip, the second semiconductor chip being connected to the control electrode through a first bonding wire, and connected to the control terminal through a second bonding wire;

a passive component mounted on a passive component mounting portion of the control terminal through a bonding material; and a resin molding that includes a surface at the first heat sink side, and a surface at the second heat sink side in a lamination direction of the first heat sink, the second heat sink, and the first semiconductor chip, the resin molding integrally sealing the first semiconductor chip, the second semiconductor chip, the passive component, at least a part of the first heat sink and the second heat sink, the first bonding wire, the second bonding wire, the island, and a part of the control terminal including the passive component mounting portion, wherein:

a part of the single lead frame is bent with respect to a remaining part of the single lead frame such that a surface of the island on which the second semiconductor chip is mounted is located closer to the first heat sink side surface of the resin molding at the rear surface than a surface of the first heat sink on which the first semiconductor chip is mounted and the passive component mounting portion of the control terminal; and the passive component is mounted on the passive component mounting portion of the control terminal at the one surface.

2. The semiconductor device according to claim 1, wherein:

the control terminal is included in a plurality of control terminals;

a part of the plurality of control terminals are connected to the island; and the control terminal connected to the island includes a bent portion between a connection end of the control terminal connected to the island, and the passive component mounting portion.

3. The semiconductor device according to claim 1, wherein a connection surface of the first semiconductor chip connected to the first bonding wire and a connection surface of the second semiconductor chip connected to the first bonding wire are located in an identical plane.

4. The semiconductor device according to claim 1, wherein a part of the first heat sink at the one surface is exposed from the resin molding.

5. A method for manufacturing a semiconductor device, the semiconductor device including:

a lead frame that includes
one surface and a rear surface opposite to the one surface, and further includes
a first heat sink, an island, and a control terminal, the island and the control terminal being separated from the first heat sink;

a first semiconductor chip that includes
a first main electrode arranged at a facing surface of the first semiconductor chip facing the rear surface, and further includes
a control electrode and a second main electrode, the second main electrode paired with the first main electrode, the control electrode and the second main electrode being arranged at a surface of the first semiconductor chip opposite to the facing surface, the first main electrode being connected to the first heat sink through solder;

a second heat sink arranged opposed to the surface of the first semiconductor chip at which the control electrode is arranged, the second heat sink being connected to the second main electrode through solder;

a second semiconductor chip fixed to the island at the rear surface to control driving of the first semiconductor chip, the second semiconductor chip connected to the control electrode through a first bonding wire, and connected to the control terminal through a second bonding wire;

a passive component mounted on a passive component mounting portion of the control terminal through a bonding material; and a resin molding that includes a front surface at the first heat sink side, and a rear surface at the second heat sink side in a lamination direction of the first heat sink, the second heat sink, and the first semiconductor chip, the resin molding integrally sealing the first semiconductor chip, the second semiconductor chip, the passive component, at least a part of the first heat sink and the second heat sink, the first bonding wire, the second bonding wire, the island, and a part of the control terminal including the passive component mounting portion, the method comprising:

using the lead frame, which is bent, such that a surface of the island on which the second semiconductor chip is mounted is located closer to the first heat sink side front surface of the resin molding at the rear surface than a surface of the first heat sink on which the first semiconductor chip is mounted and the passive component mounting portion of the control terminal;

forming a connection body that integrates the lead frame and the first semiconductor chip by reflow of the solder between the first heat sink and the first semiconductor chip, and fixing the second semiconductor chip at the island;

connecting the control electrode and the second semiconductor chip through the first bonding wire after fixing the second semiconductor chip, and further connecting the second semiconductor chip and the control terminal through the second bonding wire;

reversing the connection body and positioning the reversed connection body at the second heat sink after connecting the second semiconductor chip through the first bonding wire and the second bonding wire, carrying out reflow of the solder between the second heat sink and the connection body, and mounting the passive component on the passive component mounting portion of the control terminal at the one surface through the bonding material; and molding the resin molding after mounting the passive component.

6. The method for manufacturing the semiconductor device according to claim 5,
   wherein the lead frame is bended such that connection surface of the first semiconductor chip connected to the first bonding wire and connection surface of the second semiconductor chip connected to the first bonding wire are located in an identical plane.

7. The method for manufacturing the semiconductor device according to claim 5, further comprising:
   exposing a part of the first heat sink at the one surface from the resin molding.

\* \* \* \* \*